(12) United States Patent
Hallam et al.

(10) Patent No.: US 11,646,571 B2
(45) Date of Patent: May 9, 2023

(54) COMPACT MODULAR ELECTRICAL LOAD MANAGEMENT SYSTEM

(71) Applicant: Generac Power Systems, Inc., Waukesha, WI (US)

(72) Inventors: Jonathan Hallam, Vancouver (CA); Jonathan Li, Vancouver (CA); Ching Kun Meng, Vancouver (CA)

(73) Assignee: Generac Power Systems, Inc., Waukesha, WI (US)

( * ) Notice: Subject to any disclaimer, the term of this patent is extended or adjusted under 35 U.S.C. 154(b) by 280 days.

(21) Appl. No.: 17/076,551

(22) Filed: Oct. 21, 2020

(65) Prior Publication Data

US 2021/0119443 A1    Apr. 22, 2021

Related U.S. Application Data

(60) Provisional application No. 62/924,555, filed on Oct. 22, 2019.

(51) Int. Cl.
*H02H 7/22* (2006.01)
*G01R 19/165* (2006.01)
*H02H 1/00* (2006.01)

(52) U.S. Cl.
CPC ......... *H02H 7/22* (2013.01); *G01R 19/16571* (2013.01); *G01R 19/16576* (2013.01); *H02H 1/0007* (2013.01)

(58) Field of Classification Search
CPC .. H02H 3/04; H02H 3/08; H02H 3/46; H02H 7/22; H02H 1/0007; G01R 19/16571; G01R 19/16576

USPC ....................................................... 361/91.1
See application file for complete search history.

(56) References Cited

U.S. PATENT DOCUMENTS

| 4,223,288 | A | 9/1980 | Stiner | |
| 9,831,664 | B1* | 11/2017 | Sastry | ...................... H02B 1/00 |
| 2018/0205206 | A1* | 7/2018 | Bazhinov | ............... G06Q 50/06 |
| 2021/0083506 | A1* | 3/2021 | Rao | ............................ G05F 1/10 |

FOREIGN PATENT DOCUMENTS

WO    WO-2017174994 A1 * 10/2017 ............... G01K 3/14

OTHER PUBLICATIONS

"Canadian Application Serial No. 3,096,699, Examiner's Rule 86(2) Report dated Aug. 31, 2022", 3 pgs.

* cited by examiner

*Primary Examiner* — Kevin J Comber
(74) *Attorney, Agent, or Firm* — Schwegman, Lundberg & Woessner, P.A.

(57) ABSTRACT

A modular load management system comprises one or more compact modules designed to fit in the wiring troughs of a standard AC distribution panel of a building. The modules include one or more input terminals to receive electrical power from one or more circuit breakers in the panel and deliver power to load circuits of the building via one or more output terminals. The modules contain at least one disconnect switch for disconnecting circuits from breakers in response to a remote or locally-generated control signal. The modules may also include current sensors on some or all terminals, such that power and energy flow may be monitored on a per-circuit basis.

19 Claims, 11 Drawing Sheets

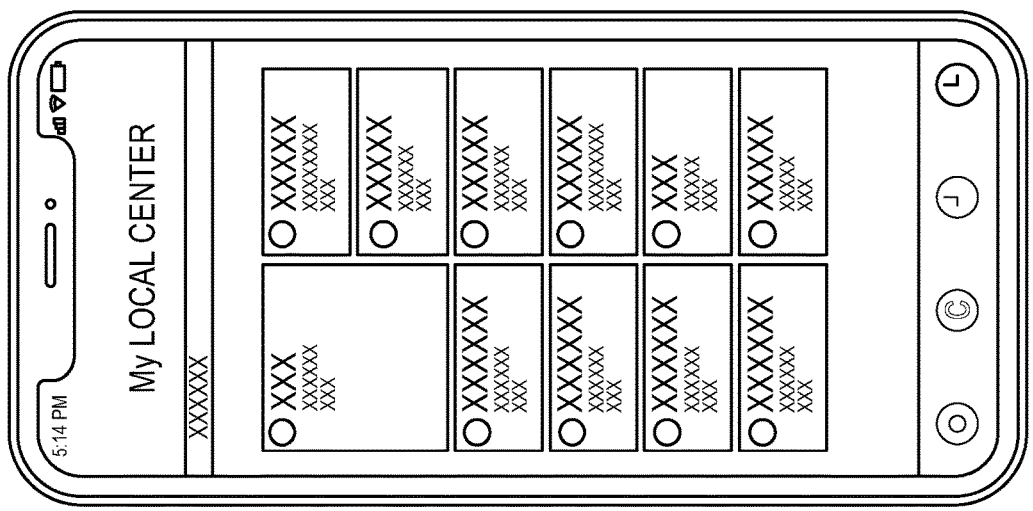
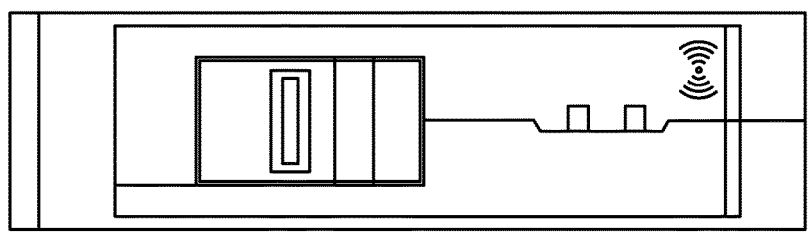
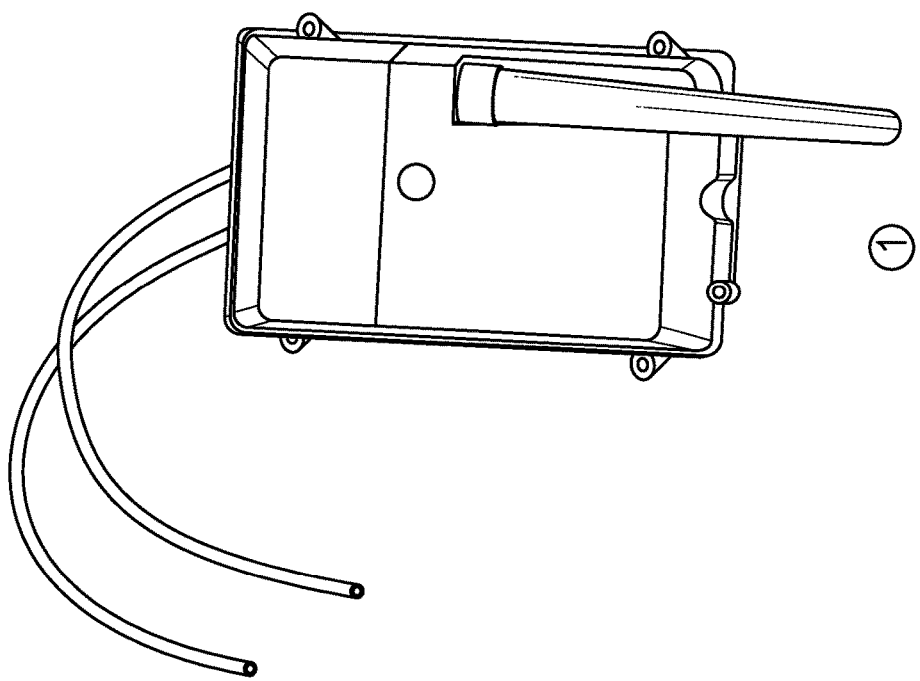
FIG. 2 (Prior Art)

Front  Back

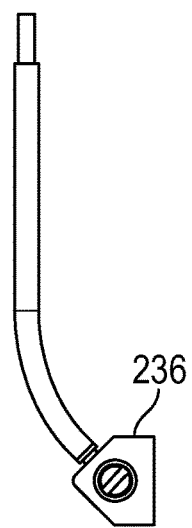
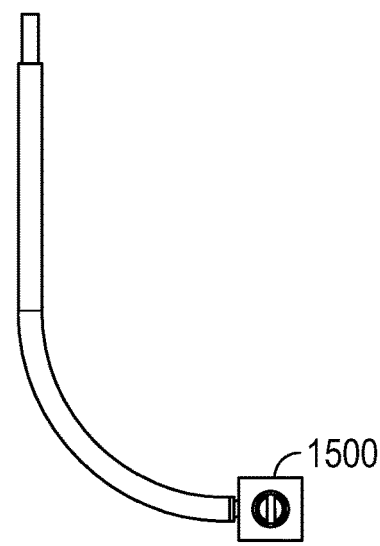
FIG. 15A  FIG. 15B
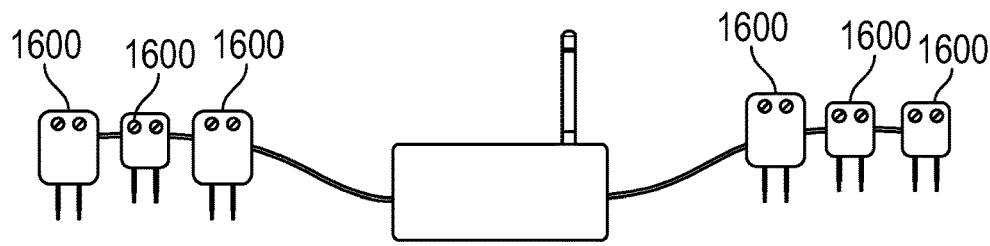
FIG. 16
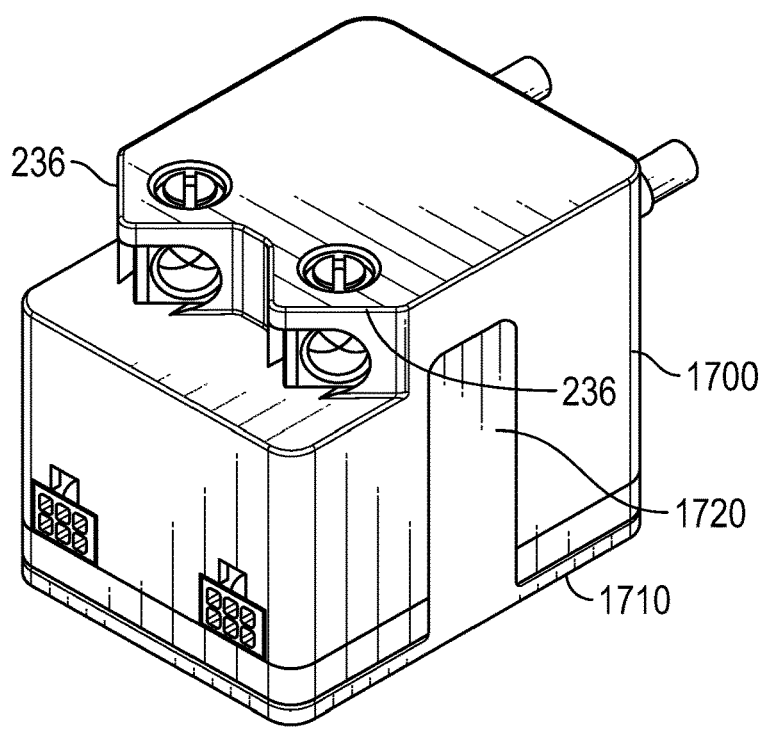
FIG. 17

COMPACT MODULAR ELECTRICAL LOAD MANAGEMENT SYSTEM

RELATED APPLICATION

This application claims priority to U.S. Provisional Application Ser. No. 62/924,555 (entitled Compact Modular Electrical Load Management System, filed Oct. 22, 2019) which is incorporated herein by reference.

BACKGROUND

The importance of distributed energy generation, storage, and management is increasing rapidly, due to cost and performance advances in solar energy and battery technologies as well as customer demand for secure clean power systems. Dynamic pricing and Demand Response programs provide incentives to curtail or time-shift large loads to save money. Home automation technology enables active management of circuits or individual loads. Load management is particularly valuable to owners of battery energy storage systems because battery systems have limited power and energy storage capacity. Customers want the ability to manage onsite loads—for example to prevent the operation of low-priority loads, to prevent multiple large loads from operating simultaneously, or to time-shift large loads to take advantage of dynamic electric rates or the availability of solar energy.

Commercialized and announced load management products offer some of these capabilities, but the offerings are expensive, complex, and often require significant disruption to the existing electrical infrastructure of the building.

FIG. 1 is a prior art block diagram that illustrates components of a photovoltaic system with a battery energy storage system with a critical loads panel. This approach offers only two priority levels, and no flexibility to adjust which circuits are high priority after installation. It also requires a special inverter with a disconnect switch and re-routing of circuits.

FIG. 2 is a prior art diagram illustrating a smart breaker that requires a special breaker panel and is very expensive.

FIG. 3 is a prior art diagram illustrating a smart breaker that requires removal and replacement of an entire main panel.

FIG. 4 is a prior art diagram illustrating a smart breaker that requires an extra box and wiring in and out of a panel.

SUMMARY

A modular load management system comprises one or more compact modules designed to fit in the wiring troughs of a standard AC distribution panel of a building. The modules include one or more input terminals to receive electrical power from one or more circuit breakers in the panel and deliver power to load circuits of the building via one or more output terminals. The modules contain at least one disconnect switch for disconnecting circuits from breakers in response to a remote or locally generated control signal. The modules may also include current sensors on some or all terminals, such that power and energy flow may be monitored on a per-circuit basis.

The modules may be configured to connect end-to-end or via jumper cables to manage some or all of the circuits in the panel. One or more modules may contain a microprocessor, communications interface, or other means of implementing home energy management functionality via local or remote cloud-based control.

BRIEF DESCRIPTION OF THE DRAWINGS

FIG. 2 is a prior art diagram illustrating a smart breaker that requires a special breaker panel and is very expensive.

FIGS. 15A and 15B illustrate the difference in wiring when using the angled connectors on the left, and a standard connector on the right side according to an example embodiment.

FIG. 16 illustrates multiple nodes daisy chained together according to an example embodiment.

FIG. 17 illustrates an LMU node with an adjustable mount according to an example embodiment.

DETAILED DESCRIPTION

Figure 1:
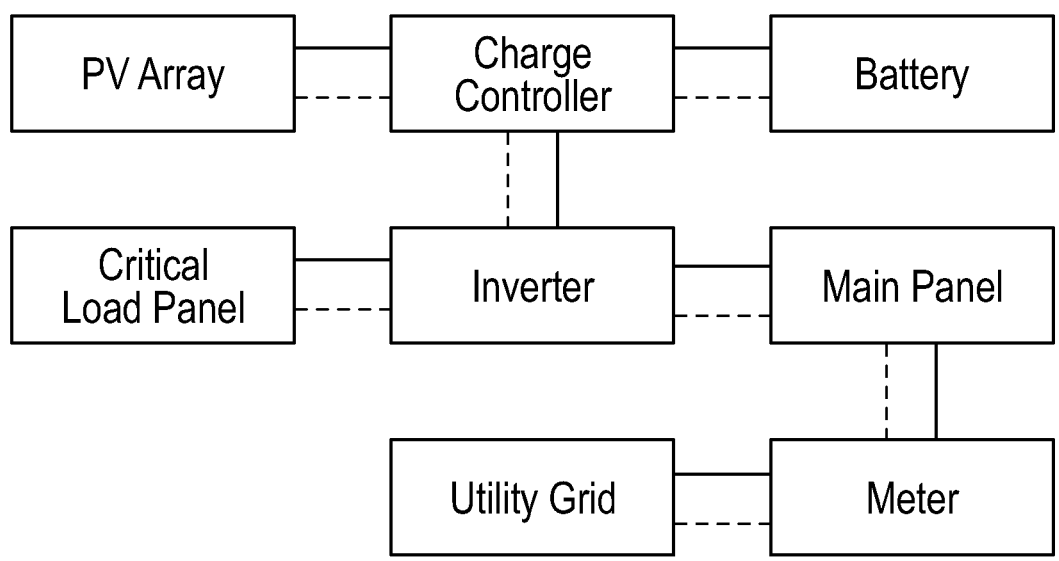
FIG. 1 is a prior art block diagram that illustrates a battery energy storage system with a critical loads panel.
Figure 3:
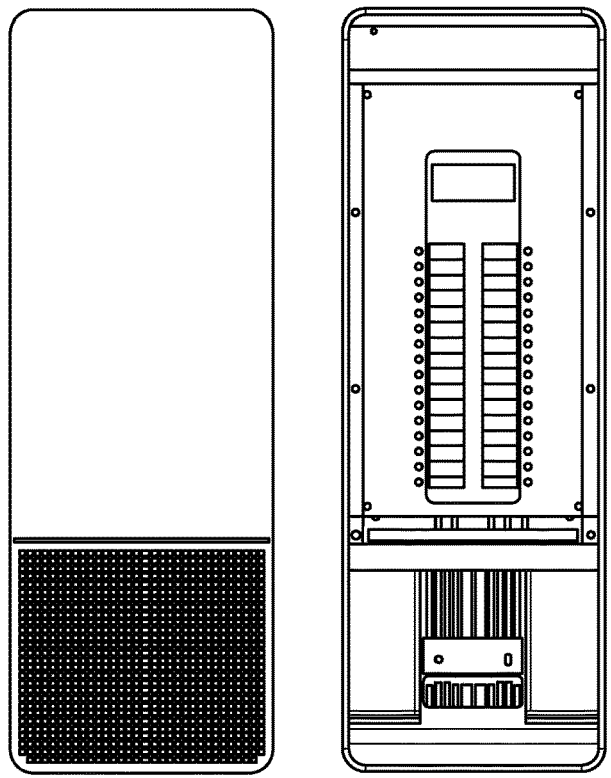
FIG. 3 is a prior art diagram illustrating a smart breaker that requires removal and replacement of an entire main panel.
Figure 4:
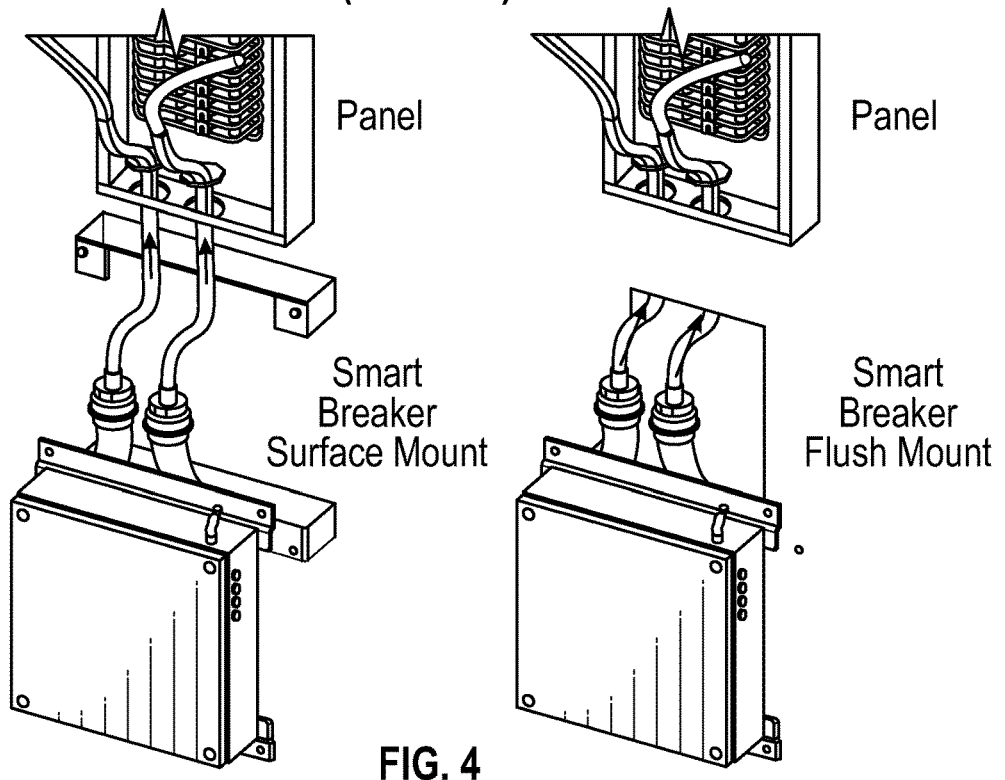
FIG. 4 is a prior art diagram illustrating a smart breaker that requires an extra box and wiring in and out of a panel.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized, and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software in one embodiment. The software may consist of computer executable instructions stored on computer readable media or computer readable storage device such as one or more non-transitory memories or other type of hardware-based storage devices, either local or networked. Further, such functions correspond to modules, which may be software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system, turning such computer system into a specifically programmed machine.

The functionality can be configured to perform an operation using, for instance, software, hardware, firmware, or the like. For example, the phrase "configured to" can refer to a logic circuit structure of a hardware element that is to implement the associated functionality. The phrase "configured to" can also refer to a logic circuit structure of a hardware element that is to implement the coding design of associated functionality of firmware or software. The term "module" refers to a structural element that can be implemented using any suitable hardware (e.g., a processor, among others), software (e.g., an application, among others), firmware, or any combination of hardware, software, and firmware. The term, "logic" encompasses any functionality for performing a task. For instance, each operation illustrated in the flowcharts corresponds to logic for performing that operation. An operation can be performed using, software, hardware, firmware, or the like. The terms, "component," "system," and the like may refer to computer-related entities, hardware, and software in execution, firmware, or combination thereof. A component may be a process running on a processor, an object, an executable, a program, a function, a subroutine, a computer, or a combination of software and hardware. The term, "processor," may refer to a hardware component, such as a processing unit of a computer system.

Furthermore, the claimed subject matter may be implemented as a method, apparatus, or article of manufacture using standard programming and engineering techniques to produce software, firmware, hardware, or any combination thereof to control a computing device to implement the disclosed subject matter. The term, "article of manufacture," as used herein is intended to encompass a computer program accessible from any computer-readable storage device or media. Computer-readable storage media can include, but are not limited to, magnetic storage devices, e.g., hard disk, floppy disk, magnetic strips, optical disk, compact disk (CD), digital versatile disk (DVD), smart cards, flash memory devices, among others. In contrast, computer-readable media, i.e., not storage media, may additionally include communication media such as transmission media for wireless signals and the like.

Figure 5:
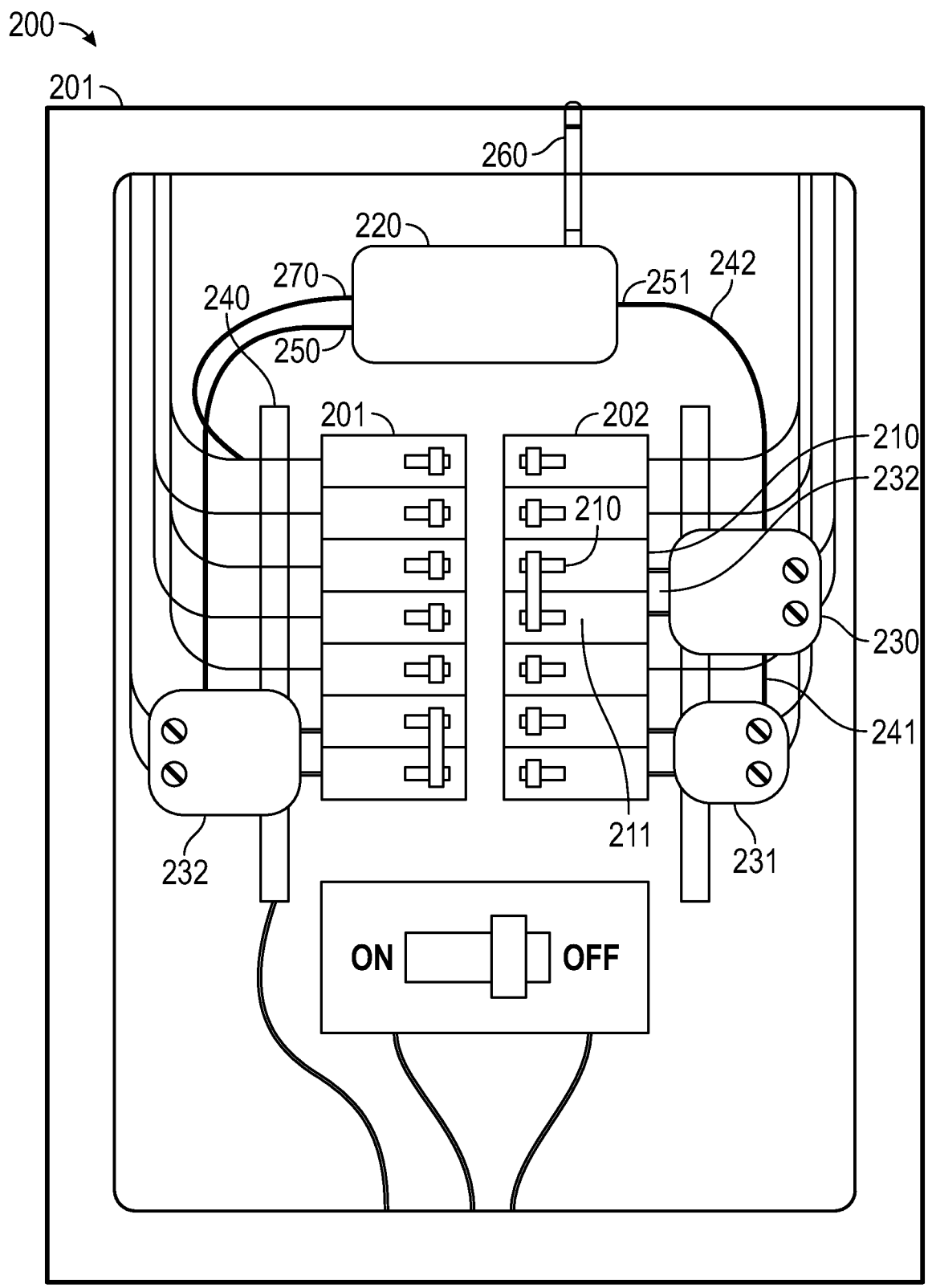
FIG. 5 is a block diagram illustrating a the basic configuration of a compact modular load management system (LMS) according to an example embodiment.

FIG. 5 illustrates the basic configuration of a compact modular load management system (LMS) 200. A circuit panel 201 contains two rows of breakers 201, 202 etc., which may be part of an existing electrical system in a home or business. Load circuit breakers 210, 211 etc. conduct current to the various electrical needs of the building. The LMS comprises an LMS head unit 220, at least one compact modular Load Management Units (LMU) 230, 231 etc., and signal-level cabling 240, 241, 242, etc. to connect the LMS head unit 220 to a first LMU 230, and thence to subsequent LMUs 231, 232 in a daisy-chain fashion. There are two connectors 250, 251 on the head unit 220, one on the left, one on the right. This allows a daisy connection per row of breakers for neater cabling within the panel. An antenna 260 is attached directly to the head unit 220 via an antenna mount, with an option for an extension cable so antenna can be mounted on a knockout of panel for better wireless connectivity. Power connection 270 is located on the head unit 220 to power the entire system.

The LMS 200 in one embodiment is designed to fit within a wiring trough of a common electrical AC distribution panel 201. Note that the LMUs 230, 231, 232 may be connect directly to the inside of the panel on the same sheet metal to which the breakers 210, 211 are attached. This may be done by the use of self-tapping screws in one embodiment. Further methods of attachment are illustrated below.

Figure 6:
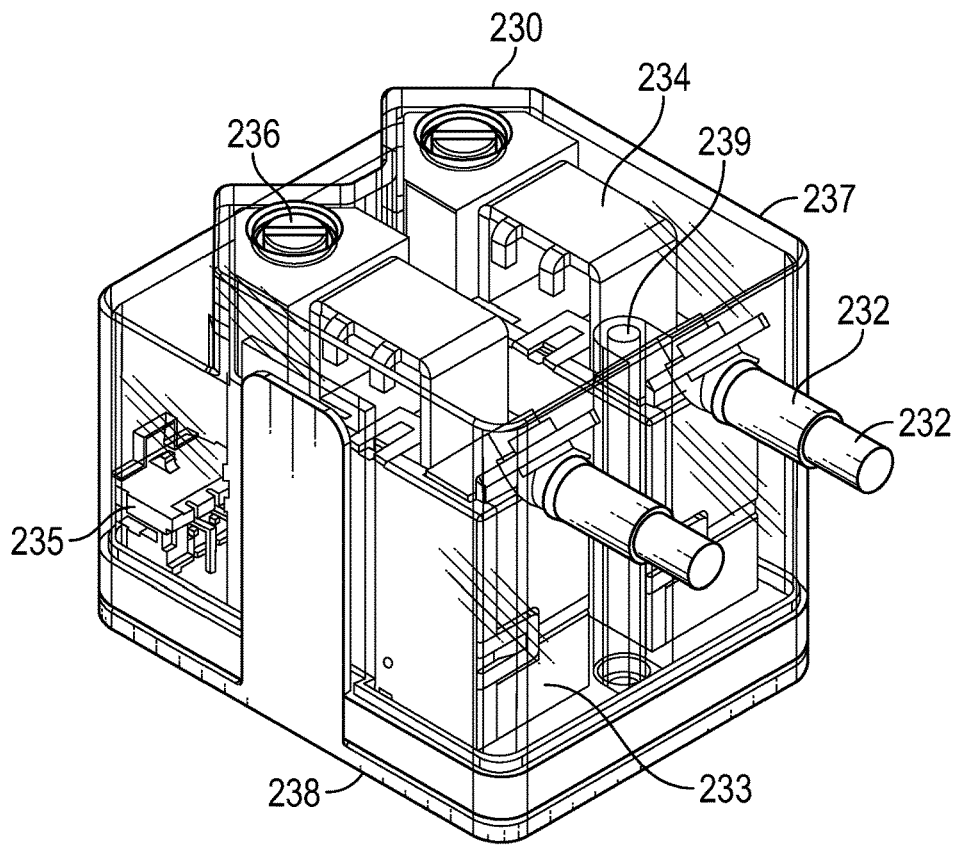
FIG. 6 is a block perspective view illustrating a load management unit (LMU) according to an example embodiment.

FIG. 6 is a block perspective view illustrating an LMU 230. Each LMU 230 comprises at least one input lead 232, positioned and spaced to align to the output terminals of the breakers in the panel, an internal relay or other switch 233, internal current and voltage sensing 234, a logic control circuit 235, and one or more output terminals 236, all housed in a durable, compact enclosure 237. An optional mounting plate 238 facilitates securing the LMU to the interior of the breaker panel. On one side that is visible in FIG. 6, a tube 239 allows access via screwdriver or long screw to the plate 238 or directly to the back of the panel for securing the node to the panel.

To install the LMU 230:

Step 1—Turn off the main breaker, open the front panel cover exposing the internal wirings.

Steps 2-4 illustrate the installation steps for the LMS head unit 220.

Step 2—Mount the LMS head unit 220 to an empty spot near the top or bottom of the panel with self-tapping screws directly onto the rear metal surface of the panel.

Step 3—Connect the power cable to the LMS head unit 220, the other end of the power cable should be connected to the appropriate phase A, phase B, and Neutral within the panel.

Step 4—Assemble antenna cable assembly may be done by securing the antenna 260 onto the antenna mount. Attach the antenna cable to the LMS head unit 220 and insert antenna mount through a free circular knockout opening.

Steps 5-10 illustrate the installation steps for the LMU 230.

Step 5—Locate the circuit breaker 210, 211 intended for the installation, remove any existing wiring connections to the breaker.

Step 6—Secure the mounting plate 238 to the rear metal surface of the panel in-line with the breaker, leave a 10-20 mm distance to the breaker.

Step 7—Feed the LMU breaker side wires into the circuit breaker screw terminals.

Step 8—Clip LMU into the mounting plate and adjust to the appropriate height.

Step 9—Trim the existing wires from step 5 and feed them into the LMU screw terminals.

Step 10—Connect the LMU to the LMS head unit with the included cable.

Figure 7:
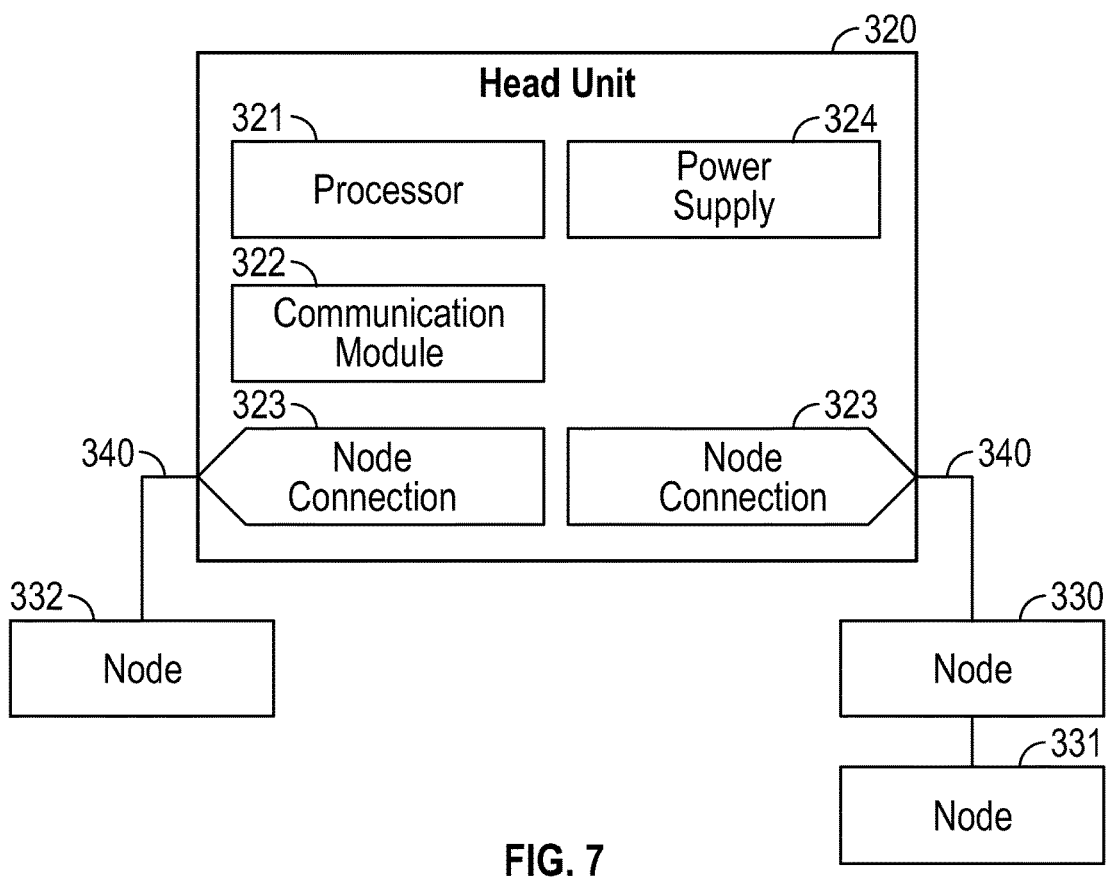
FIG. 7 is a block diagram illustrating a head unit with daisy chain connected LMU nodes according to an example embodiment.

FIG. 7 is a block diagram illustrating an LMU head unit 320 with daisy chain connected LMU nodes 330, 331, and 332. The head unit 320 comprises a data processor unit 321 such as a microprocessor, a communication module 322 that communicates with a local or remote information processing system (for instance via cellular, WiFi, ethernet, zigbee, etc.), a first node connection port 323 for communicating with LMUs 330, 331 (for example via RS485, CANbus, etc), and a power supply 324, which may also measure voltage, frequency, or other power signals. A first signal-level cable 340 communicates two-way data and signal-level power to load management unit 330, 331. A second node connection port 323 communicates with LMU 332 via second cable 340.

This is the default configuration. There is an optional configuration where a smart disconnect switch (SDS) replaces the head unit 320. See FIG. 9. LMUs will either connect to a head unit 320 or to the SDS. The head unit means the system is a stand-alone system, whereas with the SDS, the system may be a piece of a bigger unit.

Figure 8:
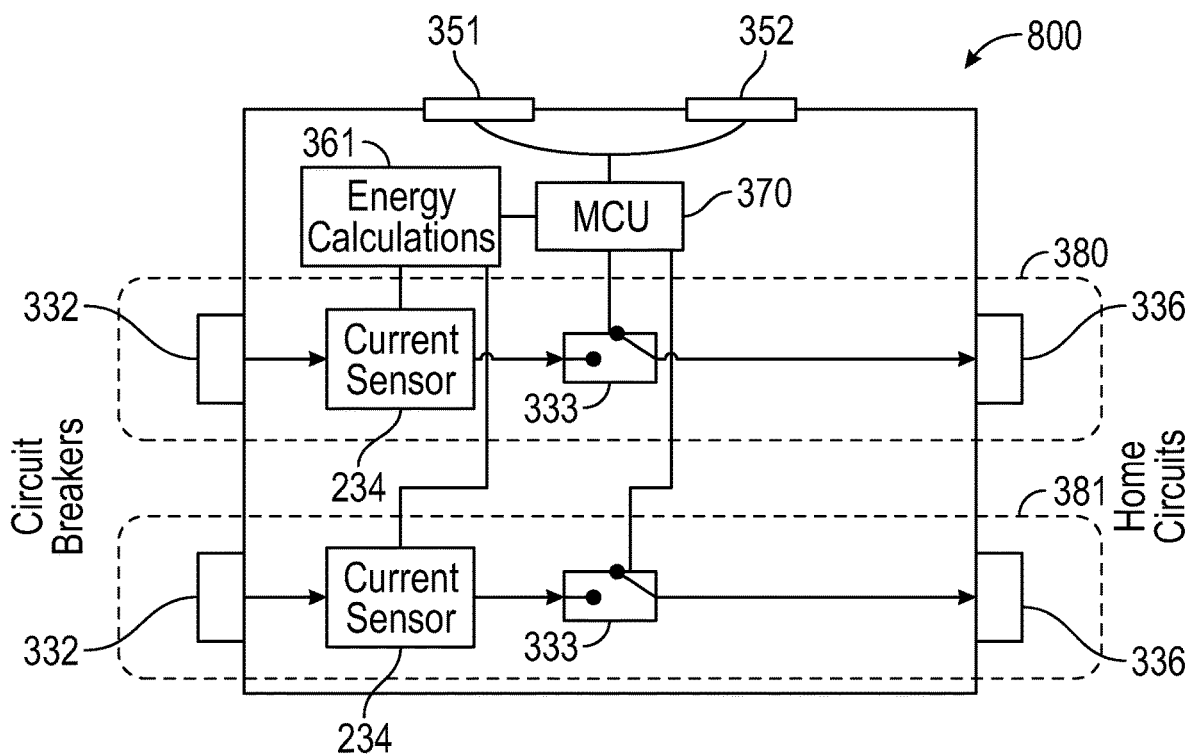
FIG. 8 is a block diagram of an LMS node according to an example embodiment.

FIG. 8 is a block diagram of an LMS node 800. The LMU comprises of 1 or more load channels 380, 381, an energy calculation block 361, a micro-control unit (MCU) 370 and two node connections 351, 352 for communication with the head unit or smart disconnect switch (SDS) or other LMUs. Each load channel includes input terminals 332, a current sensor 234, a load switch 333 and an output terminal. For a single pole breaker, an LMS node 800 may be used with only one input 332, current sensor 234, switch 333, and output 336. It may be cost effective to group multiple load channels 380, 381 into one LMU, such as the two illustrated at the two strings of elements: input terminal 232, current sensor 234, switch 233, and output 236. In further embodiments, up to ten or so load channels may be accommodated in one LMU.

Load switches 333 may be mechanical switches such as electromechanical relays, or alternatively silicon-based switches, configured to close or break the flow of current between input terminals 332 and output terminals 336. Current sensors 234 configured to measure the current in each circuit may be resistive shunt-type sensors, hall-effect sensors, or other sensing technologies. An Energy Measurement IC or ADC 361 may be used to process the data by performing energy calculations before transferring to the MCU 370. Node connections 351, 352 are configured to send and receive signals from the head unit or SDS (such as the current measurements in the LMU) and control the power switches according to commands from the head unit/SDS or configurable parameters set within the LMU. There are two node connections on each device (node or head/SDS) to facilitate daisy chaining connections between devices. All node connections are linked to the same power and data bus.

In operation, on power-up the head unit data processor may perform system checks on the connected components, and then sets the condition of the load switches based on pre-defined defaults (for instance, the system may be configured to default to closed switches for a grid-connected system and open switches for an off-grid system. The head unit then attempts to establish communication to provide remote control of this system to the user or automated processes.

The switch may be configured to open dynamically based on droop in voltage or frequency below a threshold. For example, when frequency drops below 59 Hz, the switch will open, disconnecting the load. There are many other reasons for opening and closing the switches. In a situation where a Home has a backup battery, the system can see how much power the Home is using and disconnect certain loads to make sure the battery is not overloaded when switching from Grid to Battery power. When the grid is down and the Home is being powered by battery, disconnecting specific loads can extend life of the battery. In one embodiment, the largest loads in the home may be cut in response to one or more of the above reasons, such as Pool pumps, Water heaters and Air conditioners. Variations in the voltage can come from surges or noise on the line. For frequency, if the Home includes a generator, there may be some issues syncing together.

The system may also be designed to open and close based on command from an inverter, SDS, or other local master, default to closed unless remote command (e.g. utility DR), operate in a cyclic lockout mode to enable several large loads to run in sequence, operate based on a hierarchical nested set of rules, and open and close based on battery saving profiles set by the user or AI.

In a situation where the Home has a backup battery, the system can see how much power the Home is using and disconnect certain loads to make sure the battery is not overloaded when switching from Grid to Battery power.

When the grid is down and home is being powered by battery, disconnecting specific loads can extend the life of battery. For example, disconnecting large loads such as pool pumps and water heaters may extend battery by a few hours.

Figure 9:
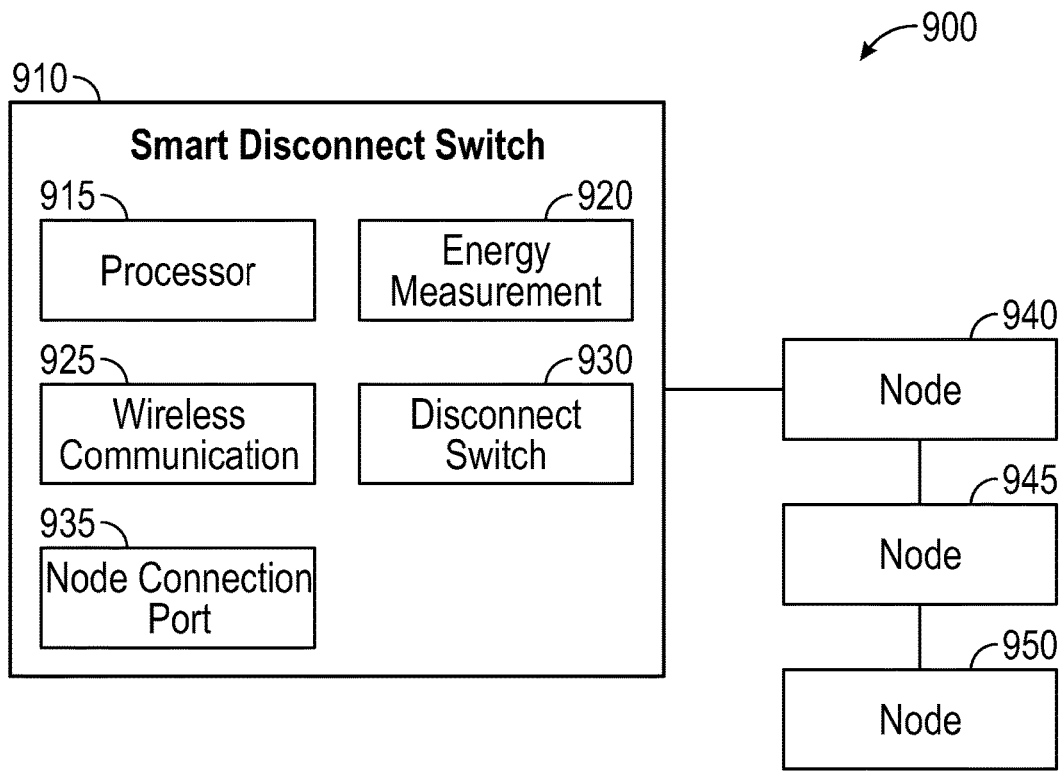
FIG. 9 is a block diagram of a system that includes a smart disconnect switch according to an example embodiment.

FIG. 9 is a block diagram of a system 900 that includes a smart disconnect switch (SDS) 910. This is an optional configuration where the SDS 910 replaces the head unit.

In some embodiments the LMUs may be connected to an internal or external disconnect switch or transfer switch via digital communication as described above. In this case a data processing unit 915 within the disconnect switch 910 may process signals from the LMUs and command operation of the individual circuit switches. The SMU 910 may include an energy measurement unit 920, wireless communications unit 925, disconnect switch 930, and node connection port 935 for coupling to one more nodes 940, 945, and 950.

In some embodiments, an elongated LMU may include 2, 3, 4, 5, 6, 7, 8, 9, 10, 11, 12, or more circuits. The head unit may include ports for main service CTs. A single LMU may connect and control multiple circuit breakers.

The com cable in some embodiments may carry neutral, allowing the units to self-power and operate autonomously.

An LMU with no signal from the head unit can make autonomous decisions to switch the relay depending on different scenarios such as failure modes and overcurrent detection.

In one embodiment, DIP switches on the top surface of the LMU allows On/Off/Remote functions, providing a physical override.

Overload Protection:

Scenario—When a grid outage occurs, and a battery will become the primary source of power for the home delivered through the circuit breaker panel and LMUs. The LMUs may process data representative of sensed current via the LMU current sensors and process the data to provide energy utilization information. The energy utilization information may be transmitted via the communication circuitry and antenna to one or more user devices, either directly or via one or more intermediate servers which may further process the information.

The load management system can detect how much current power is required to power the home and see how much power the battery can provide. With this information, the LMS will take action and disconnect loads utilizing the LMU disconnect switches based on a predefined priority to prevent the battery from being overloaded.

Figure 10:
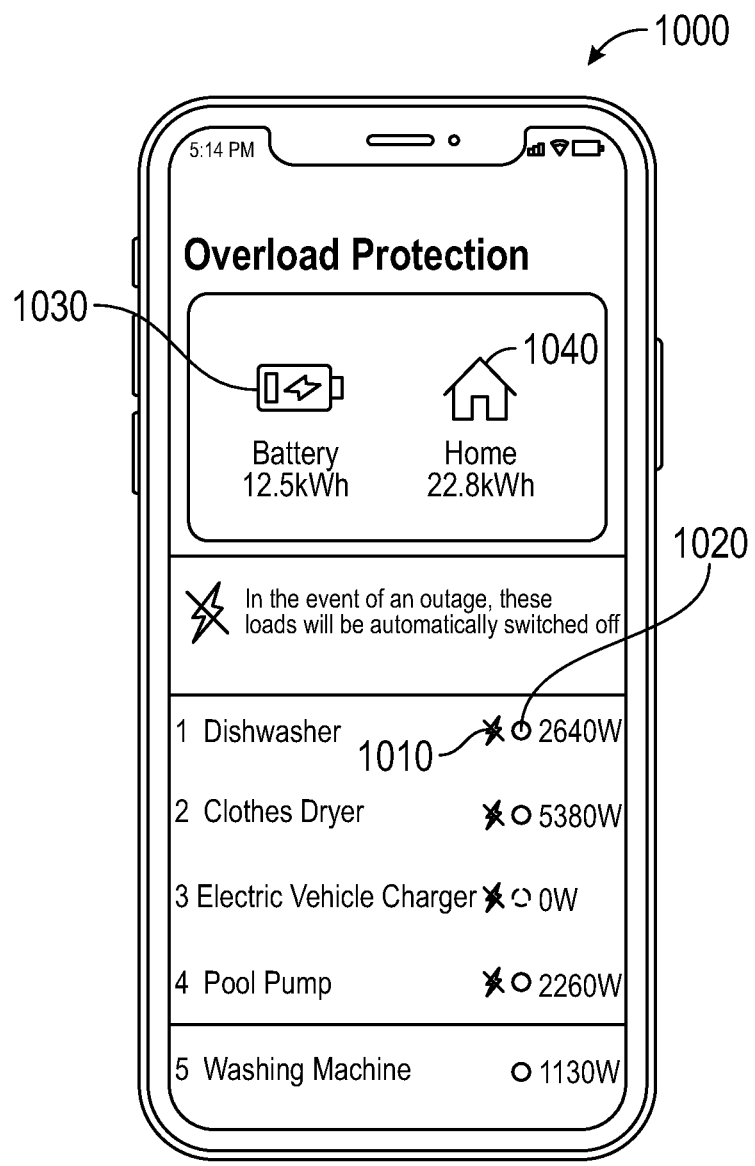
FIG. 10 is a screen shot of an overload protection user interface on a mobile device according to an example embodiment.

FIG. 10 is a screen shot 1000 of an overload protection user interface on a mobile device. Battery Life Optimization:

Scenario—After an outage and Overload protection has stabilized the home energy consumption. The system will allow the user to select which loads to shed to increase battery life by displaying the loads via mobile device display with user interface selection mechanisms, such as checkboxes or highlighting, for selection of loads to shed. In one embodiment, an icon 1010 represents loads that will be automatically switched off in the event of a power outage. The loads with icon 1010 includes the dishwasher, clothes dryer, electric vehicle charger, and pool pump. Colored buttons 1020 for each load in the list illustrate which loads are currently drawing power such as via a green color, with a red color indicating the load is currently not drawing power.

The mobile device display may also include current battery power available at 1030 and a total current energy utilization 1040 for the Home.

Figure 11:
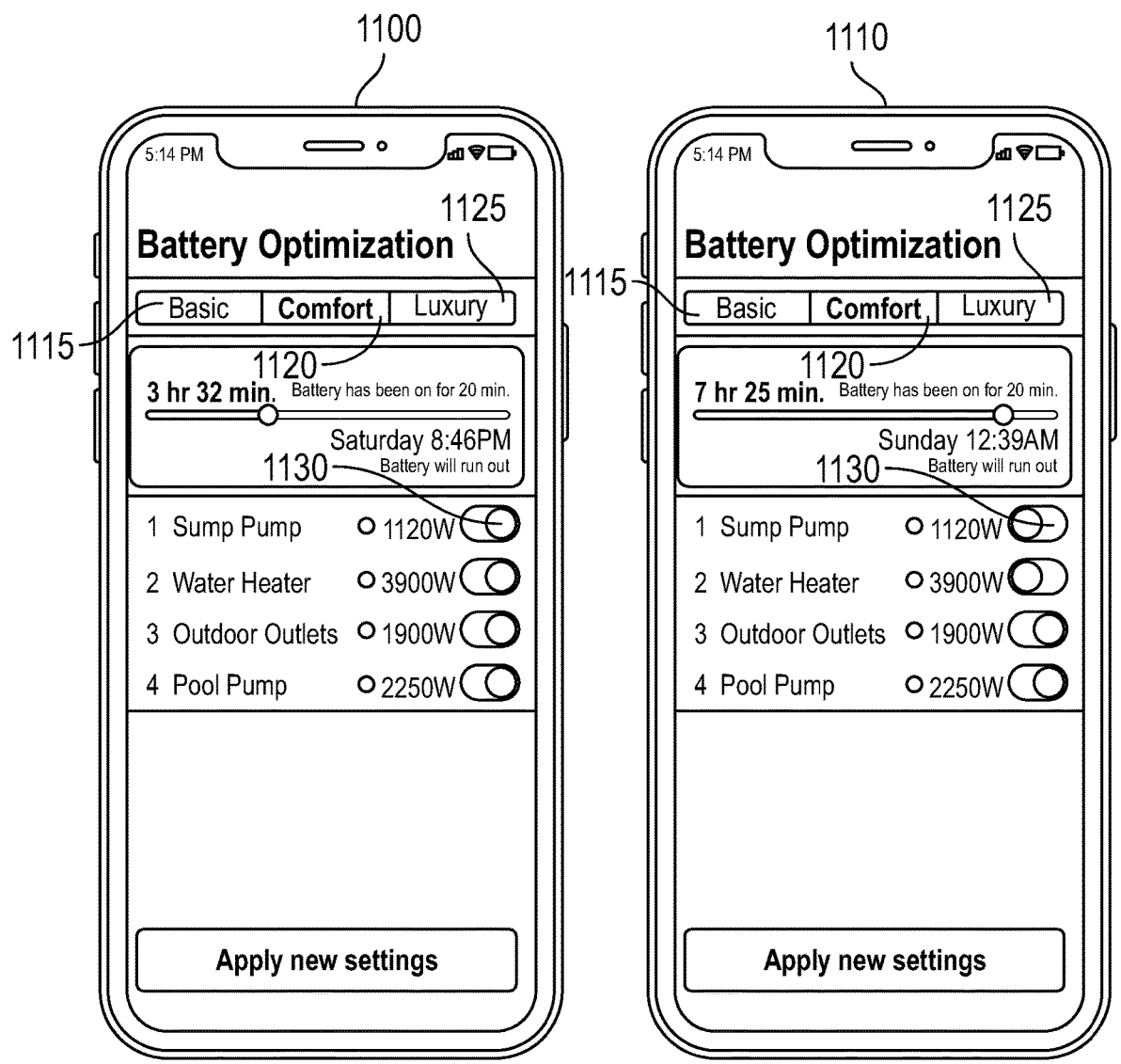
FIGS. 11 shows screen shots of a user interface illustrating loads that will be automatically shed in the event of an outage to extend battery life according to an example embodiment.

FIG. 11 shows screen shots 1100, 1110 of a user interface illustrating battery optimization selections, basic 1115, comfort 1120, and luxury 1125 selections. The load management system can calculate how long the home can run off the battery. Time remaining for the current selection, comfort 1120, is illustrated. A list of loads is also displayed and may be turned off via touch screen switch as shown at 1130. Screen shot 1100 shows four loads, all switched on with a corresponding remaining battery time of 3 hours 32 minutes. Screen shot 1200 shows the same four loads with the first two loads, sump pump and water heater turned off, resulting in a remaining battery time of 7 hours 25 minutes. Thus the user interface allows users to both select a level of comfort, as well as loads to turn on or off in each selected level, balancing life style desires with remaining battery life during grid or other power supply outages.

Figure 12A:
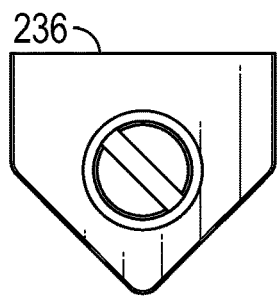
FIG. 12A, 12B, 12C, and 12D show multiple views of the output terminal 236 that can accept wires from opposing directions according to an example embodiment.
Figure 12C:
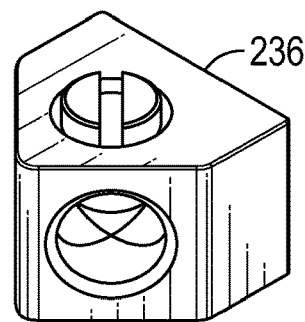
Figure 12B:
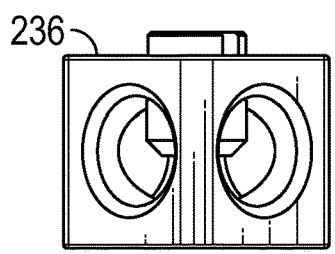
Figure 12D:
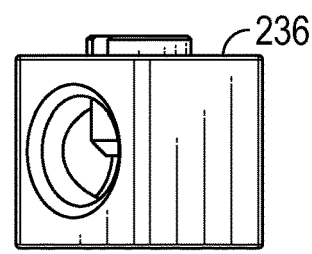
Figure 13:
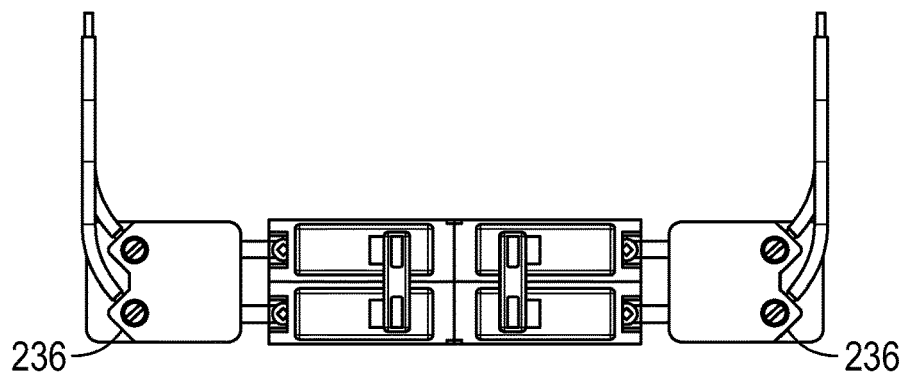
FIGS. 13 illustrates wiring coupled to the terminal of FIG. 12 according to an example embodiment.
Figure 14:
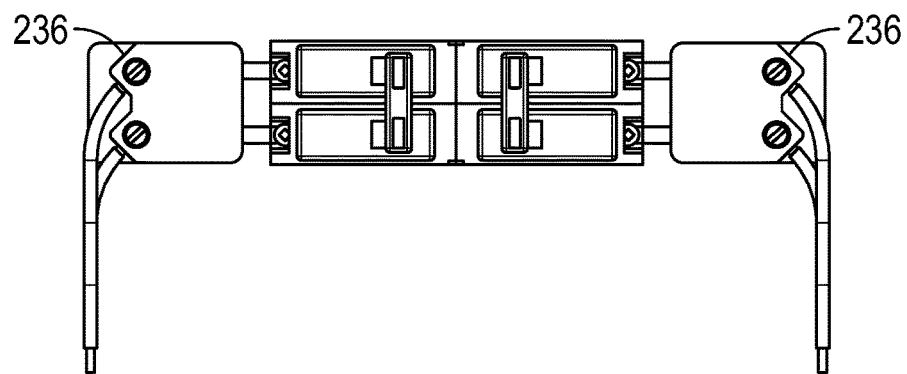
FIGS. 14 illustrates wiring coupled to the terminal of FIG. 12 according to an example embodiment.

FIGS. 12A, 12B, 12C, and 12C shows multiple views, top, side, perspective, and end views, of the output terminal 236 that can accept wires from opposing directions. The custom designed terminal can accept wires from opposing directions, allowing the product to be installed in panels where home wiring can enter from the top or the bottom. The pair of approximately 45-degree entry points (openings on two separate planes that are at a right angle to each other and each being at 45 degree angles from a surface to which the terminal is attached) of the terminal 236 reduces the wire bending radius providing greater flexibility than a single orthogonal entry point. Other entry point angles may be used in further embodiments to reduce wire bending radius may be used. From the figures below, the entry point to the terminal is 45 degrees instead of requiring a full 90-degree turn. This would reduce the required wire bending radius significantly.

FIGS. 13, 14, 15A, and 15B illustrate wiring coupled to the terminal 236 of FIG. 12. The architecture of this product requires one head unit which includes the central processing unit and the wireless connectivity. The head unit is capable of connecting to 20+ node units and communicate through RS485. This feature allows users to connect node units to fulfill their home configuration. Different flavor nodes (switch current capability, size, single pole, dual pole) may be selected that fit requirements. The node units can be daisy chained together so it's not a requirement for node units to connect directly to the head. Daisy chaining allows for cleaner and simpler wiring within the breaker panel. Daisy-chaining further allows for the smallest form-factor for each atomic unit, optimizing panel fit & therefore compatibility.

FIG. 15A and 15B illustrate the difference in wiring when using the angled connector 236 and a standard connector 1500 respectively. Note that more lateral space away from the connector is required for the standard connector 1500, whereas the angled connector 236 facilitates the use of less lateral space to run the wiring orthogonal to the connector 236 and up or down the panel to the load. The use of the angled connectors 236 facilitates fitting more LMUs into a panel and more flexibility in wiring, as more LMUs may be placed closer to breakers and leave more room on lateral sides of the panel for wiring.

The angled connectors 236 include two connectors that are arranged at approximately 90-degree angles from each other to reduce the curvature of coupled wiring within the circuit breaker panel to one or more loads. In some embodiments, the connectors may be angled between 80 degrees and 100 degrees. In some embodiments, the connectors may be angled between 60 degrees and 120 degrees. Other angles less than 180 degrees that provide the benefit of reduce radius of curvature of wiring may be used in further embodiments FIG. 16 illustrates multiple nodes 1600 daisy chained together. Autonomous Overload Protection: In one embodiment the disconnect switch is activated automatically based on conditions in the home's electricity network so as to protect site-level generation equipment. Examples of such equipment include, without limitation, reciprocating engine generators, photovoltaic systems, and battery systems.

Figure 18:
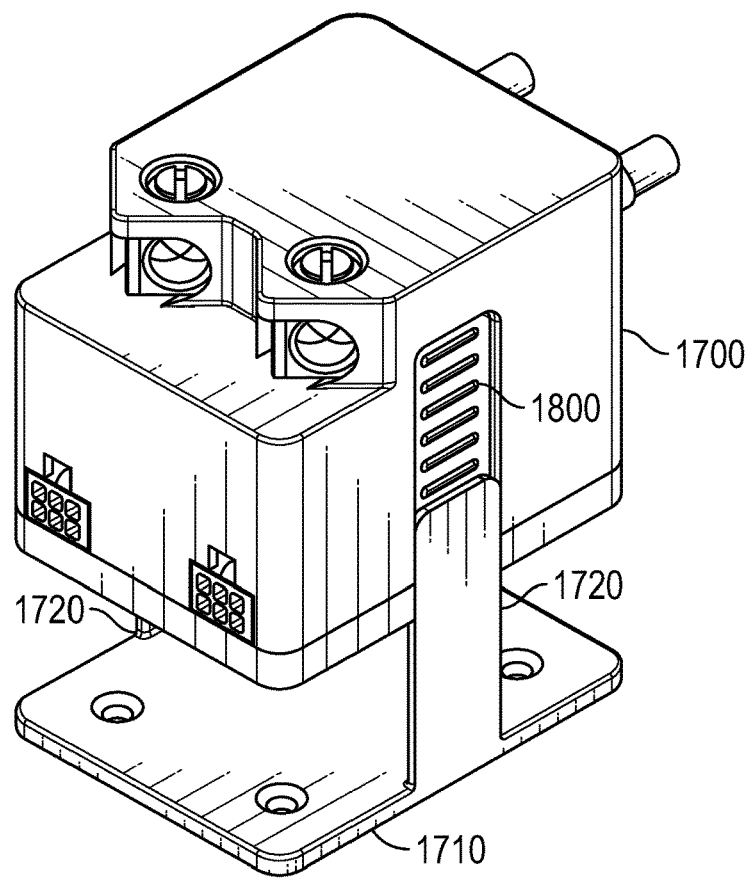
FIG. 18 illustrates an LMU node with an adjustable mount with the LMU node spaced from a base of the mount according to an example embodiment.

FIGS. 17 and 18 illustrate an LMU node with an adjustable mount. FIG. 17 is a perspective view of LMU node 1700. FIG. 18 is a perspective view of the node 1700 in a different position. A mount 1710 may be screwed or otherwise attached by glue or other means for fastening the node to the inside back of an electrical distribution panel. Tabs 1720 extending out from a base of the mount may be used to couple the LMU node at various heights above the base of the mount 1700. Note the notches 1800 in the LMU node side that are designed to mate with a protrusion (not shown) on the node facing sides of the tabs 1720 to secure the node a desired height above the base of the mount. Such mounting allows potentially dense wiring in the panel to be routed between the tabs and between the base of the mount and the bottom of the node.

Figure 19:
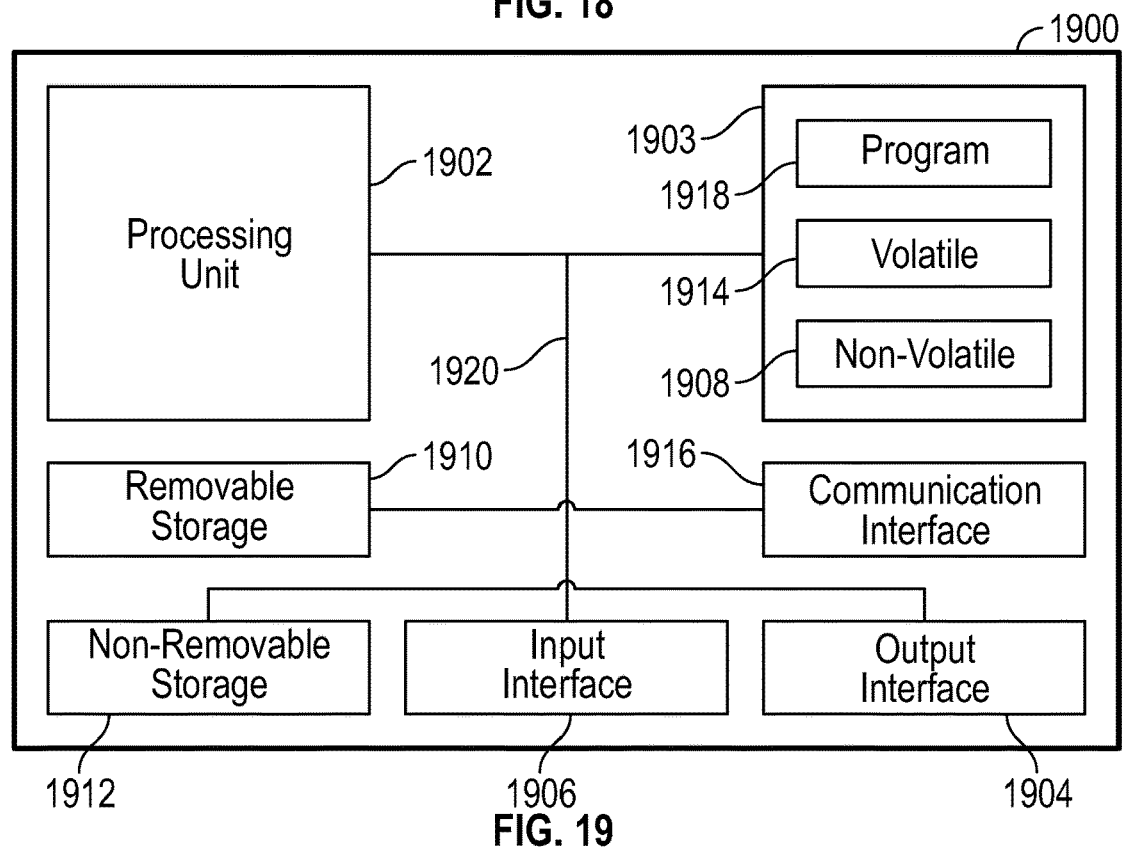
FIG. 19 is a block schematic diagram of a computer system to implement one or more example embodiments.

FIG. 19 is a block schematic diagram of a computer system 1900 to implement devices and control circuitry to perform methods and algorithms according to example embodiments. All components need not be used in various embodiments.

One example computing device in the form of a computer 1900 may include a processing unit 1902, memory 1903, removable storage 1910, and non-removable storage 1912. Although the example computing device is illustrated and described as computer 1900, the computing device may be in different forms in different embodiments. For example, the computing device may instead be a smartphone, a tablet, smartwatch, smart storage device (SSD), or other computing device including the same or similar elements as illustrated and described with regard to FIG. 19. Devices, such as smartphones, tablets, and smartwatches, are generally collectively referred to as mobile devices or user equipment.

Although the various data storage elements are illustrated as part of the computer 1900, the storage may also or alternatively include cloud-based storage accessible via a network, such as the Internet or server-based storage. Note also that an SSD may include a processor on which the parser may be run, allowing transfer of parsed, filtered data through I/O channels between the SSD and main memory.

Memory 1903 may include volatile memory 1914 and non-volatile memory 1908. Computer 1900 may include— or have access to a computing environment that includes—a variety of computer-readable media, such as volatile memory 1914 and non-volatile memory 1908, removable storage 1910 and non-removable storage 1912. Computer storage includes random access memory (RAM), read only memory (ROM), erasable programmable read-only memory (EPROM) or electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions.

Computer 1900 may include or have access to a computing environment that includes input interface 1906, output interface 1904, and a communication interface 1916. Output interface 1904 may include a display device, such as a touchscreen, that also may serve as an input device. The input interface 1906 may include one or more of a touchscreen, touchpad, mouse, keyboard, camera, one or more device-specific buttons, one or more sensors integrated within or coupled via wired or wireless data connections to the computer 1900, and other input devices. The computer may operate in a networked environment using a communication connection to connect to one or more remote computers, such as database servers. The remote computer may include a personal computer (PC), server, router, network PC, a peer device or other common data flow network switch, or the like. The communication connection may include a Local Area Network (LAN), a Wide Area Network (WAN), cellular, Wi-Fi, Bluetooth, or other networks. According to one embodiment, the various components of computer 1900 are connected with a system bus 1920.

Computer-readable instructions stored on a computer-readable medium are executable by the processing unit 1902 of the computer 1900, such as a program 1918. The program 1918 in some embodiments comprises software to implement one or control algorithms described herein. A hard drive, CD-ROM, and RAM are some examples of articles including a non-transitory computer-readable medium such as a storage device. The terms computer-readable medium and storage device do not include carrier waves to the extent carrier waves are deemed too transitory. Storage can also include networked storage, such as a storage area network (SAN). Computer program 1918 along with the workspace manager 1922 may be used to cause processing unit 1902 to perform one or more methods or algorithms described herein.

EXAMPLES

A modular load management system comprising
a. One or more compact load management modules comprising
  i. One or more input terminals
  ii. One or more output terminals
  iii. One or more switches connected between input and output terminals,
  iv. One or more communication ports
b. Where the load management modules are configured to fit inside the wiring chase of an existing circuit panel Autonomous Overload Protection. An embodiment of any of the above examples wherein the disconnect switch is activated automatically based on conditions in the home's electricity network so as to protect site-level generation equipment. Examples of such equipment include, without limitation, reciprocating engine generators, photovoltaic systems, and battery systems.

An embodiment wherein the triggers for automatic activation include, without limitation, AC power frequency conditions, AC power voltage conditions, and circuit-level load conditions.

An embodiment wherein distinct setpoints for trigger conditions can be configured so as to establish priority of which loads are disconnected first during an overload protection event.

An embodiment wherein a 'dead-man's switch' or watchdog mechanism is employed to ensure that the state of the switch in each LMU is 'connected' whenever communication with the head node is lost.

An embodiment wherein energy consumed by the circuit is accumulated over time and such information is protected from loss/rollback by detecting immanent power outages and saving data to non-volatile memory prior to complete power loss has occurred.

An embodiment wherein a commissioning tool or application is used to record which loads/circuits a given relay will be connected to prior to installation.

A device will switch relays when virtually no current is flowing through using zero crossing detection. This reduces wear on the components, prevent arcing between contacts of the switch, reduce noise.

Nodes may be interconnected with expandable coil-like cables to adapt to different lengths. This will reduce the number of cables in the panel.

Nodes may be secured to the inside of the panel with a height-adjustable mount, this will allow ease of install for varying breaker wire entry heights.

A head device may connect to the nodes stated above and also unique modules such as metering-only nodes, hot water heater control and lighting dimmers.

Nodes can be software-configured to act as a dual-pole switch for split-phase 240V applications, or two single-pole switches for 120V applications.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. A load management system for a circuit breaker panel, the system comprising:
   a load management unit adapted to be supported within the circuit breaker panel, the load management unit including a first circuit path comprising:
   an input for coupling to a circuit breaker within the circuit breaker panel;
   an output for coupling to loads, wherein the output comprises an angled connector having two connectors arranged at an angle from each other; and
   a disconnect switch coupled between the input and the output, the disconnect switch also coupled to receive a control signal to control the switch to disconnect the input from the output.

2. The system of claim 1 wherein the load management unit further comprises a current sensor coupled between the input and the output, the current sensor having a current sensor output providing signals representative of current flow between the input and the output.

3. The system of claim 1 further comprising one or more additional circuit paths for coupling to one or more additional circuit breakers within the circuit breaker panel.

4. The system of claim 1 further comprising multiple additional load management units supported within the circuit breaker panel.

5. The system of claim 4 further comprising a head unit adapted to be supported within the circuit breaker panel for controlling the load management unit disconnect switches.

6. The system of claim 5 wherein the head unit controls the load management unit disconnect switches based on at least one of sensed voltage and frequency levels to avoid an impending overload condition.

7. The system of claim 5 wherein the head unit controls the load management unit disconnect switches in response to a battery becoming a primary source of power for the loads.

8. The system of claim 7 wherein the head unit disconnect switches based on predefined priority for loads in response to the battery becoming the primary source of power for the loads.

9. The system of claim 5 wherein the load management units are coupled to the head unit in a serial daisy chain manner.

10. The system of claim 1 wherein the two connectors are arranged at approximately 90-degree angles from each other to reduce the curvature of coupled wiring within the circuit breaker panel to one or more loads.

11. The system of claim 1 further comprising a base mount for coupling to an inside back of the circuit breaker panel, the mount having tabs extending away from the inside back of the circuit breaker panel to couple to the load management unit.

12. The system of claim 11 wherein the tabs support the load management unit an adjustable distance from the inside back of the circuit breaker panel.

13. The system of claim 1 wherein the load management unit further comprises:
 a current sensor coupled between the input and the output, the current sensor having a current sensor output providing signals representative of current flow between the input and the output; and
 control circuitry coupled to receive the current sensor output signals and coupled to control the disconnect switch responsive to the current sensor output signals.

14. A modular load management system comprising:
 a head unit having an antenna, processor, communication module coupled to the antenna, and a first node connector of the head unit, wherein the unit is configured to connect to and within a circuit breaker panel;
 a first load management unit adapted to be supported within the circuit breaker panel, the first load management unit including a first circuit path comprising:
 a first input for coupling to a first circuit breaker within the circuit breaker panel;
 a first output for coupling to a first load, wherein the first output comprises an angled connector having two connectors arranged at an angle from each other; and
 a first disconnect switch coupled between the first input and the first output, the first disconnect switch coupled to receive a control signal via the first circuit path coupled to one of the node connectors of the head unit to control the switch to disconnect the input from the output.

15. The system of claim 14 further comprising:
 a second load management unit adapted to be supported within the circuit breaker panel, the second load management unit including the first circuit path comprising:
 a second input for coupling to a second circuit breaker within the circuit breaker panel;
 a second output for coupling to a second load; and
 a second disconnect switch coupled between the second input and the second output, the second disconnect switch coupled to receive a second control signal via the first circuit path coupled to the first node connector of the head unit to control the second switch to disconnect the second input from the second output.

16. The system of claim 15 wherein the first and second load management units are daisy chained together via the first circuit path.

17. The system of claim 16 wherein the head unit comprises a second node connector located on a opposite side of the head unit from the first node connector, wherein the head unit is configured for mounting at an end of two columns of circuit breakers in the circuit breaker panel and wherein the second node is configured to daisy chain connect further load management units coupled to circuit breaker of a column different from the column containing the first circuit breaker.

18. The system of claim 14 wherein the first load management unit further comprises:
 a current sensor coupled between the input and the output, the current sensor having a current sensor output providing signals representative of current flow between the input and the output; and
 control circuitry coupled to receive the current sensor output signals and coupled to control the disconnect switch responsive to the current sensor output signals.

19. The system of claim 18 wherein the current sensor is configured to provide data representative of current draw to the head unit, wherein the head unit is configured to communicate the data to a remote device for display of current related information to a user, and wherein the remote device is configured to facilitate a user activating the first switch to connect or disconnect the load management unit from providing current from the first circuit breaker.

* * * * *